United States Patent
Ramsey et al.

(10) Patent No.: US 6,186,812 B1
(45) Date of Patent: *Feb. 13, 2001

(54) MANUALLY OPERATED TOP LOADING SOCKET FOR BALL GRID ARRAYS

(75) Inventors: James Michael Ramsey, Sellersburg, IN (US); Paul S. Chinnock, Tucson; Jeffrey A. Farnsworth, Scottsdale, both of AZ (US)

(73) Assignee: PCD, Inc., Peabody, MA (US)

( * ) Notice: Under 35 U.S.C. 154(b), the term of this patent shall be extended for 0 days.

This patent is subject to a terminal disclaimer.

(21) Appl. No.: 09/343,615

(22) Filed: Jun. 30, 1999

Related U.S. Application Data

(63) Continuation-in-part of application No. 08/975,675, filed on Nov. 28, 1997, now abandoned.

(51) Int. Cl.[7] .................................................. H01R 11/22
(52) U.S. Cl. ............................................. 439/266; 439/259
(58) Field of Search ..................................... 439/262, 263, 439/264, 265, 266, 259, 260, 261, 341, 342

(56) References Cited

U.S. PATENT DOCUMENTS 5,833,483 * 11/1998 Lai et al. .............................. 439/342

* cited by examiner

*Primary Examiner*—Paula Bradley
*Assistant Examiner*—Alexander Gilman

(74) *Attorney, Agent, or Firm*—Perkins, Smith & Cohen, LLP; Jerry Cohen; Harvey Kaye

(57) ABSTRACT

A socket for a ball grid array integrated circuit package (BGA) with an array of electrical contacts that extend through holes in a slidable plate. The arrangement of spacing the holes and the electrical contacts therein provides entry openings that allow the ball contacts of a BGA package to enter the openings. The contacts are cupped or angled to mate with the side and top of the ball contacts of the ball grid array package. The contact surface of the ball grid array package is inserted into the socket without any interfering structure, and there may be guide surfaces to align the ball contacts with the openings. A manually rotatable cam actuated in one direction by an arm drives the plate parallel to the plane of the ball contacts to widen the openings to allow easy entry of the balls into the holes. Rotating the arm in the other directions drives the plate in the opposite direction reducing the openings. The arm is arranged at the side of the socket so as to not interfere with insertion or removal of the BGA itself. When the openings are reduced with a ball contact within the openings the balls are retained therein and electrical conductivity is provided between the ball contact and the socket electrical contact, and furthermore where the ends of the bifurcated contacts have sharp edges that penetrate any oxidation on the ball contacts to provide gas free connections. The bifurcated ends mates with the ball contacts near where the ball contacts attached to the BGA-package. This mating is above the equator of the ball and serves to retain the ball and so the BGA package itself in the socket.

7 Claims, 5 Drawing Sheets

MANUALLY OPERATED TOP LOADING SOCKET FOR BALL GRID ARRAYS

RELATED PATENTS

This patent application is a continuation-in-part of our prior U.S. application Ser. No. 08/975,675 filed on Nov. 28, 1997. Priority is hereby claimed under 35 USC 120 with respect to said prior application. With this filing said prior application is now abandoned.

This application is related to U.S. Pat. Nos. 5,578,870 and 5,646,447 both of common assignment with this patent application.

FIELD OF THE INVENTION

The present invention relates to sockets for surface mounted, high pin count integrated circuit packages, and more particularly to sockets for ball grid array integrated circuit packages.

BACKGROUND OF THE INVENTION

Surface mounted, high pin count integrated circuit packages have been dominated by quad flat packs (QFPS) with various pin configurations, for example, leadless, J-leaded, and gull wing leaded. These packages have closely spaced leads for making electrical connections distributed along the four edges of the flat packages. These packages have become limited by being confined to the edges of the flat pack even though the pin to pin spacing is small. To address this limitation, a new package, a ball grid array (BGA) is not so confined because the electrical contact points are distributed over the entire bottom surfaces of the packages. More contact points can be located with greater spacings than with the QFPS. These contacts are eutectic or solder balls, which facilitate flow soldering of the packages onto a printed circuit board.

Sockets that accept BGA's are necessary for testing, burn-in, re-programming, but are becoming popular for production use on printed circuit boards where the integrated circuit may need replacing and where the replacing is difficult and endangers the integrity of the complete board. One obstacle to production use of BGA sockets is the cost of the socket. Such sockets have been developed to satisfy the testing and burn-in needs. But these sockets often prove too expensive to be used in production. One such socket is shown in U.S. Pat. No. 5,556,293 to Pfaff. Two other such sockets are shown in U.S. Pat. Nos. 5,578,870 and 5,646,447 referenced above. The first above patent uses three plates including a bias plate, while the other two use springs. Typically such designs will be too expensive for production use.

It is an object of the present invention to provide a BGA socket needing few and simple physical operations to insert and extract an IC package and suitable for production uses.

Another object of the present invention is to provide electrical connections from the ball leads to the socket contacts and then to the runs on a printed circuit card that are reliable and of low resistance. It is a related object of the present invention to provide a contact design that provides a gas tight, reliable connection to the ball lead.

It is another object of the present invention to provide a socket where there are mechanical forces of the BGA ball leads only and none on the BGA package itself.

It is yet another object of the present invention to provide a BGA socket with no obstructions that need to be avoided when inserting and removing the BGA package.

SUMMARY OF THE INVENTION

The foregoing objects are met in a socket for ball grid array packages including a housing with a top structure, a slidable plate constructed as a part of the top structure and forming a top surface of the housing with through holes arranged to receive the ball leads of the ball grid array integrated circuit, the ball leads arranged to enter the holes from the top surface, a plurality of electrical contacts fixed to said socket with a first end arranged to extend into said holes in the top plate from a direction opposite the direction that the ball leads enter, said first ends engage the top of the ball leads above the equator on either side of a meridian of each ball, near the body of the integrated circuit, such that the ball grid array integrated circuit package is retained in said socket, and where the space between the first ends and the edges of the through holes define openings suitable for accepting the ball leads, a cam with a camming surface and an actuator arm constructed to move the slidable plate in a first and a second direction, the first direction to enlarge the opening for accepting the ball leads and the second direction to reduce said openings wherein, with said ball leads inserted into said openings, said ball leads are driven into the first ends, and where the ball leads are captured and retained between the first ends and the opposing surfaces of said holes, and thus making electrical connection from the ball leads to the electrical contacts.

In a preferred embodiment the socket electrical contact includes a bent or cupped, bifurcated or forked end. The forked extensions have edges, which contact the BGA ball leads above the balls'equator providing a detent action on the ball leads, which are thereby retained. The edges of the bifurcated end are sharp and arranged, in a preferred embodiment, to engage the ball leads on either side of a meridian. When such connections are made to the ball leads, the BGA package is captured and retained in the socket. In a preferred embodiment, there is a flat elongated portion contiguous to the cupped portion, wherein the flat portion is arranged to first contact the ball lead above the equator and astride a meridian with a sliding or wiping action that provides a gas tight, reliable electrical connection.

In a preferred embodiment, the means for driving the slidable plate containing the array of holes includes the cam axle rotated by a lever actuator arm extension in contact with the cam axle, the arm is positioned at the side of the socket and does not interfere with insertion or removal of the integrated circuit. The arm is arranged to rotate over a range of at least 90 degrees. But in other preferred embodiments the range may be substantially greater or less. In another preferred embodiment the arm may be secured at one or both ends of its travel to ensure that the open or closed condition of the socket is maintained and is visually evident.

Other objects, features and advantages will be apparent from the following detailed description of preferred embodiments thereof taken in conjunction with the accompanying drawings in which:

DETAILED DESCRIPTION OF PREFERRED EMBODIMENTS

Figure 1A:
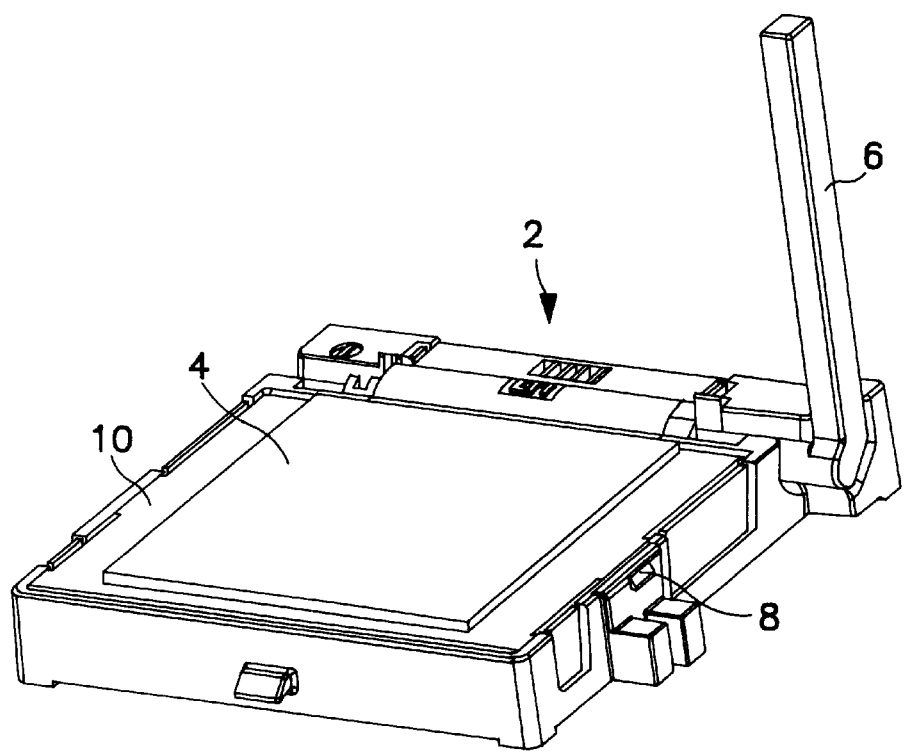
FIG. 1A is a perspective view of a preferred embodiment of a socket in the open position with a BGA integrated circuit inserted but not retained.
Figure 1B:
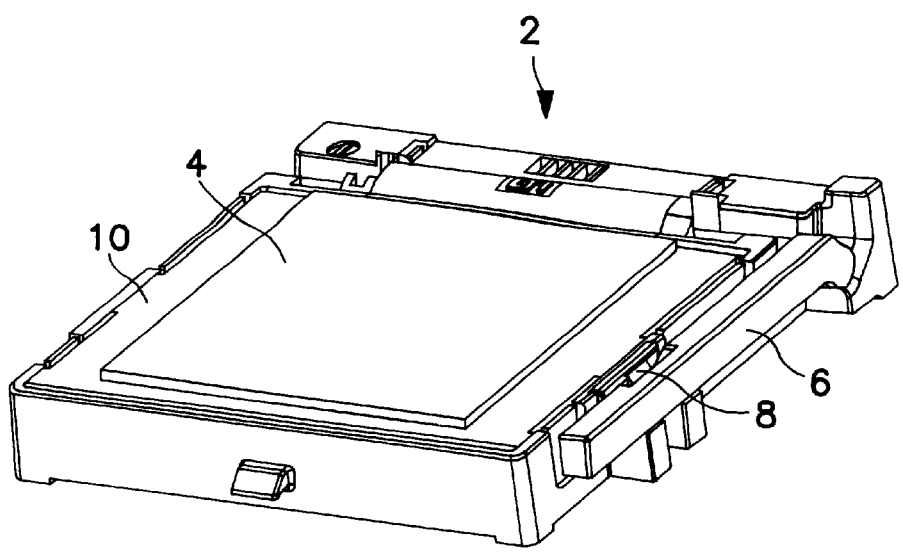
FIG. 1B is a perspective view of the preferred embodiment of FIG. 1 in the closed position with the BGA captured or retained.
Figure 2:
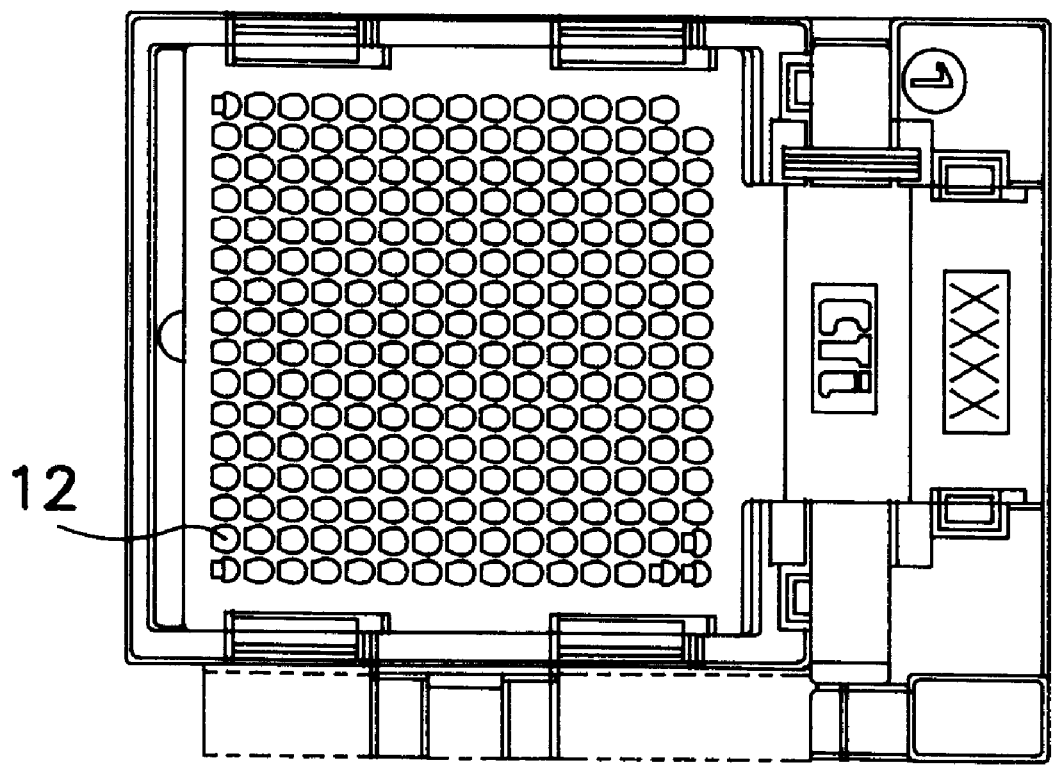
FIG. 2 is a top view of the socket of FIGS. 1A and 1B showing the hole layout.

FIG. 1A is perspective views of a socket 2 made in accordance with the present invention. The socket itself is constructed for dielectric insulating materials, which are well known in the art. A BGA integrated circuit 4 is inserted into the socket on a perforated slidable plate 10, but not retained. There is an actuator arm 6 which is raised while the socket is ready to accept a BGA, and is lowered as shown in FIG. 1B to capture and retain the BGA. The arm is secured by a clip 8, which can be pushed to release and raise the arm. FIG. 2 is a top view of the perforated slidable plate 10. The perforations of holes 12 are arranged to match the ball lead layout of the BGA.

Figure 3A:
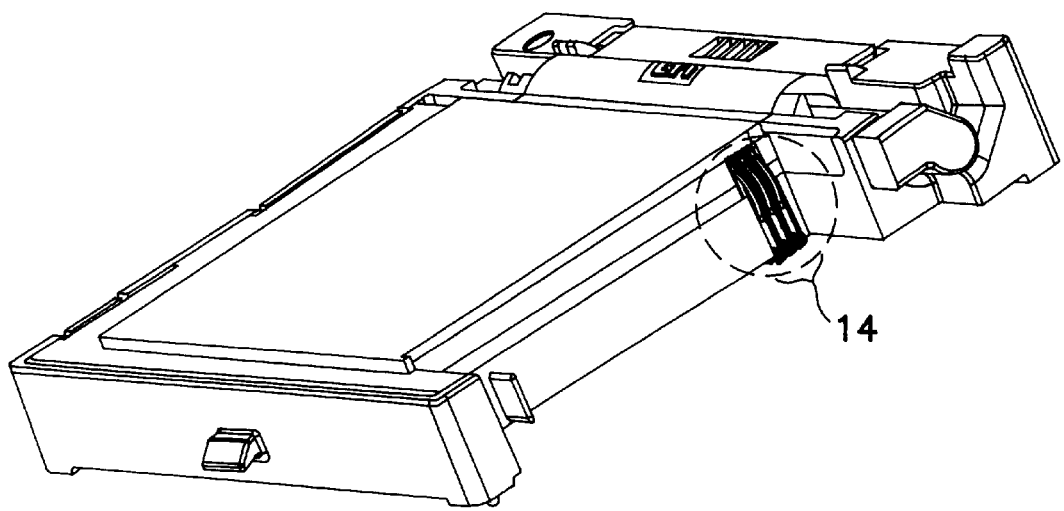
FIG. 3A is a perspective view of a preferred embodiment with a cutout showing the contacts.
Figure 3B:
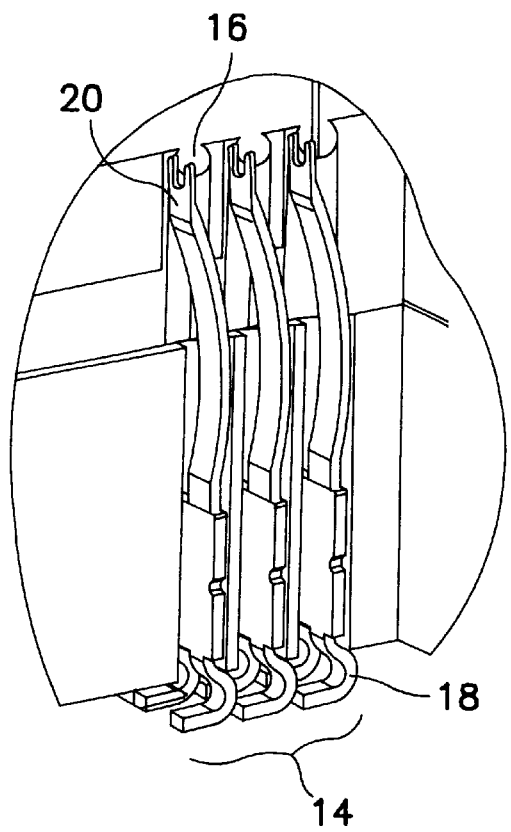
FIG. 3B is an exploded view of the cutout of FIG. 3A.

FIG. 3A shows the socket with a cutaway section showing the individual elongated socket contacts 14. FIG. 3B is an exploded view of the cutaway section showing the elongated contacts 14 in more detail shown making electrical connections to the ball lead 16 of the BGA. In FIG. 3B the elongated contacts 14, in this preferred embodiment, hooked ends 18 suitable for flow soldering on specific printed circuit board, but other type varieties of terminal configurations, e.g. straight prongs for use with plated through holes making connections to other levels on a multilevel printed circuit board. The bifurcated cupped ends 20 of the elongated socket contacts will be discussed in more detail below.

Figure 4:
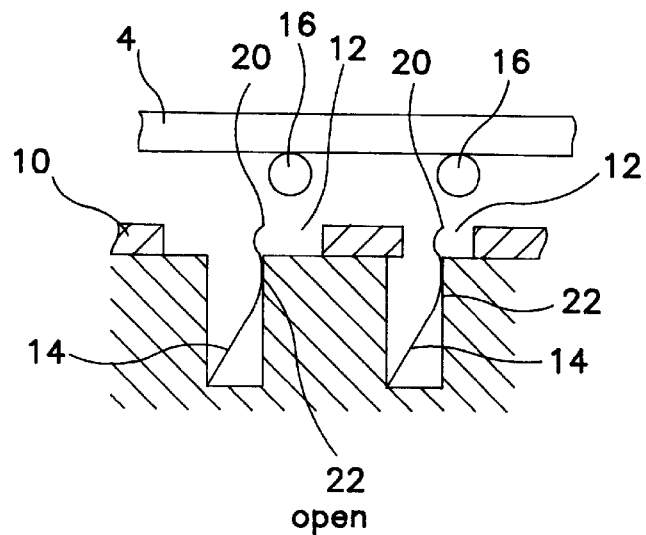
FIG. 4 is a side section view of an individual package ball lead, socket contact, and top plate in the open position.
Figure 5:
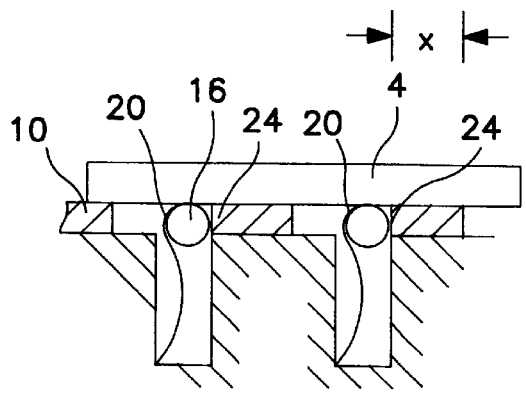
FIG. 5 is a side section view of an individual package ball lead, socket contact, and top plate in the engaged position.

FIG. 4 is a sectioned view showing the detail interaction of the ball leads 16 of a BGA 4 integrated circuit positioned just above the slidable plate 10 of the socket. The ball leads are aligned with the openings 12. The elongated contacts 14 are each resting against the abutment 22, and the design is arranged so that the slidable plate 10, as shown, makes the opening 12 large enough to accept the ball leads 16 with substantially no force required. FIG. 5 shows the same detail of FIG. 4 after the ball leads have entered the openings 12 and captured by moving the slidable plate left so that the distal edge 24 of the openings contact the ball leads and drive the ball leads into the ends 20 of the socket contacts. The distance moved X is designed to be large enough to ensure that the ball leads are driven into the ends 20 enough to move the contacts 14 away from the distal edges 24 and form a reliable, gas tight electrical connection between the ball leads 16 and the elongated contacts 14.

Figure 6A:
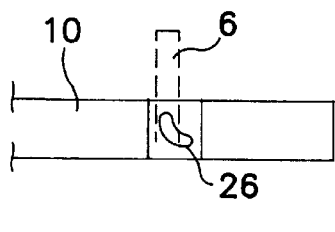
FIG. 6A is a diagrammatic view of the cam with the socket open to accept a BGA.
Figure 6B:
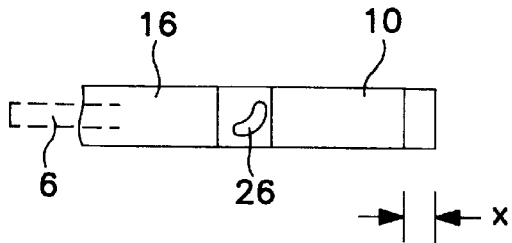
FIG. 6B is a diagrammatic view of the cam with the socket closed.

In FIG. 6A, a cam 26 is shown interacting with the slidable plate 10. In this position the arm 6 is vertical. FIG. 6B shows the relationship of the slidable plate 10 after the arm 6 has been moved through about 90 degrees. The cam 26 has lobes that, when the cam is rotated, move the plate left by an amount X.

Figure 7:
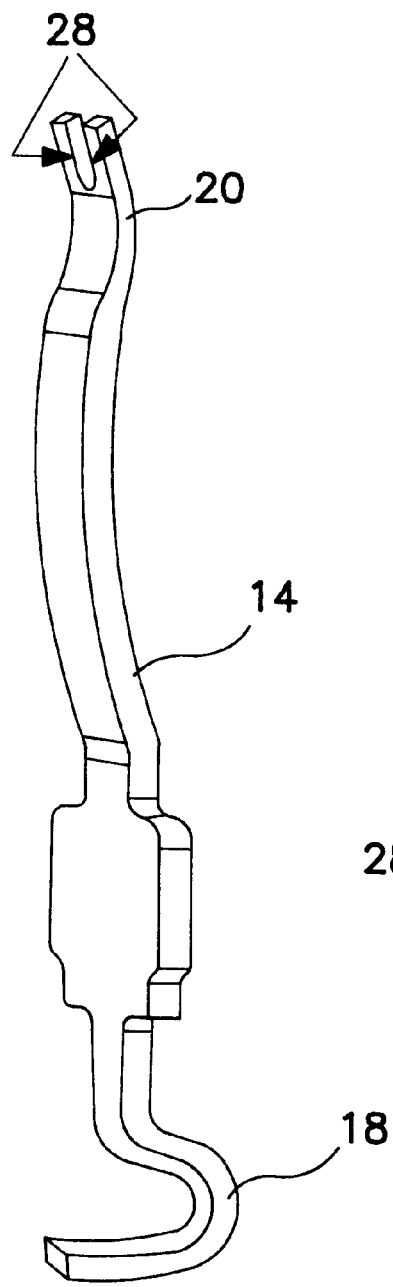
FIG. 7 is a perspective view of an individual socket contact.

FIG. 7 is a detail of one of the elongated contacts 14. There is a hooked end 18 and a bifurcated-cupped end 20. The inner edges 28 of the bifurcated ends will be the locations that will contact and grip the ball leads 16.

Figure 8:
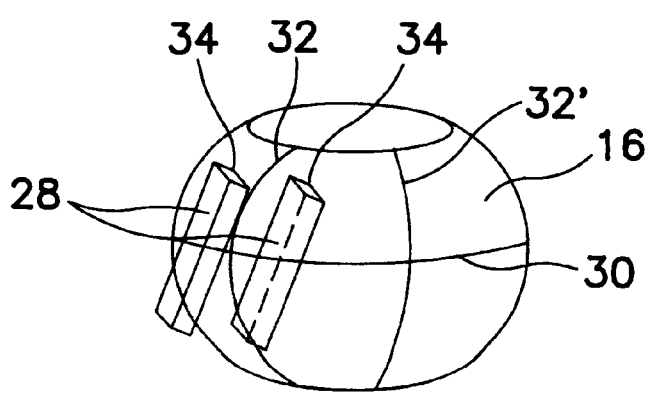
FIG. 8 is a detail showing the interaction of the ball lead and the socket contact.

FIG. 8 shows the connection between the BGA ball leads and the socket's elongated contacts in more detail. The balls are described with an equator 30 and meridians, of which two are shown 32 and 32'. The inner edges 28 of the bifurcated end contact the ball leads above the equator 30 and on either side of a meridian 32. It is noted that in this preferred embodiment, the cupping of the ends 20 occurs prior to the bifurcation but may overlap somewhat. However, the inner edges 28 of the bifurcated contacts are flat or straight at the point where the ball leads initially contact the bifurcated first end of the elongated contacts. This design provides that the extreme ends 34 of the bifurcated ends are flat or straight where they will contact the ball leads. In this design as the balls are driven into the bifurcated ends there will be a small wiping action between the inner edges 28 and the ball leads 16 that will provide a gas tight, reliable electrical connection.

It will now be apparent to those skilled in the art that other embodiments, improvements, details and uses can be made consistent with the letter and spirit of the foregoing disclosure and within the scope of this patent, which is limited only by the following claims, construed in accordance with the patent law, including the doctrine of equivalents.

What is claimed is:

1. A socket for ball grid array integrated circuit packages, said balls defining an equator for each ball wherein all the equators lie substantially in one plane parallel with the bottom surface of the integrated circuit package, and wherein each of said balls define meridians that perpendicularly intersect the equators, said socket comprising:

a housing with a top structure, a slidable plate constructed as a part of the top structure and forming a top surface of the housing with through holes arranged to receive the ball leads of the ball grid array integrated circuit, the ball leads arranged to enter the holes at the top surface, a plurality of electrical contacts fixed to said socket with a first end arranged to mate with said ball leads, and where the first ends extend into said holes in the top plate from a direction opposite the direction that the ball leads enter the holes, and wherein the space between the first ends and the edges of the through holes define openings, the openings suitable for accepting the ball leads.

a cam with a camming surface that is in intimate contact with the slidable plate and an actuator arm connected to the cam, said cam defining two positions, wherein when said cam is moved into the first position said camming surface drives the slidable plate in a first direction to enlarge the opening for accepting the ball leads, and when said cam is moved into the second position said camming surface drives the slidable plate in a second direction to reduce said openings, wherein said ball leads that have entered the holes are driven into said first ends with a wiping action thereby making electrical connections there between, and wherein the ball leads are retained between said first ends and the opposing surfaces of said holes.

2. The socket as defined in claim 1 wherein said first end of said electrical contact comprises a cupped surface such that a detent action occurs as the cupped surface engage the top of the ball leads above the equator near the body of the package such that the ball grid array integrated circuit package is retained in said socket.

3. The socket as defined in claim 1 wherein said first end of said electrical contacts comprises a bifurcated or forked extension with two edges arranged to mate with and engage said ball leads astride a meridian.

4. The socket as defined in claim 3 wherein the first end of the electrical contact further comprises:
- a cupped portion,
- a substantially flat portion located on the first end of the electrical contact contiguous with the cupped portion, but where the ball lead will first strike the substantially flat portion at a location on the ball lead above the equator near the integrated circuit.

5. The socket as defined in claim 1 wherein the first end of the electrical contact comprises an elongated section with at least one sharp edge running along the elongated section, and where said sharp edge is constructed to engage the ball lead above the equator and where the sharp edge slides along the ball.

6. A socket for ball grid array integrated circuit packages comprising:
- a housing with a top structure,
- a slidable plate constructed as a part of the top structure and forming a top surface of the housing with through holes arranged to receive the ball leads of the ball grid array integrated circuit, the ball leads arranged to enter the holes from the top surface,
- a plurality of electrical contacts fixed to said socket with a first end arranged to extend into said holes in the top plate from a direction opposite the direction that the ball leads enter the holes, said first ends comprise bifurcated cupped surfaces such that a detent action occurs as the cupped surfaces engage the top of the ball leads above the equator on either side of a meridian of each ball, near the body of the integrated circuit, such that the ball grid array integrated circuit package is retained in said socket, and where the space between the first ends and the edges of the through holes define openings suitable for accepting the ball leads,
- a cam with a camming surface in intimate contact with said slidable plate and an actuator arm constructed to move, via said camming surface, the slidable plate in a first and a second direction, the first direction to enlarge the opening for accepting the ball leads and the second direction to reduce said openings wherein, with said ball leads inserted into said openings, said ball leads are driven into said bifurcated cupped first ends with a wiping action thereby making electrical connections there between, and where the ball leads are retained between said bifurcated cupped first ends and the opposing surfaces of said holes.

7. The socket for ball grid array integrated circuit packages as defined in claim 6 wherein the first ends of the electrical contacts comprise:
- an elongated section,
- said elongated section having a cupped portion and a substantially flat portion contiguous with the cupped portion, said flat portion located where the ball lead will first strike the substantially flat portion at a location on the ball lead above the equator of the ball lead and near the integrated circuit,
- said flat portion being a bifurcated or forked extension with at least one sharp edge running along the elongation direction on each bifurcation and arranged to mate with and engage said ball leads astride a meridian, and where the at least one sharp edge slides along the ball lead to provide a gas tight reliable electrical connection.

* * * * *